United States Patent [19]

Hopta

[11] Patent Number: 4,866,306
[45] Date of Patent: Sep. 12, 1989

[54] ECL MUX LATCH

[75] Inventor: Daniel F. Hopta, Bolton, Mass.

[73] Assignee: Digital Equipment Corporation, Maynard, Mass.

[21] Appl. No.: 176,632

[22] Filed: Apr. 1, 1988

[51] Int. Cl.[4] .................. H03K 19/086; H03K 17/16; H03K 19/00; H03K 17/56
[52] U.S. Cl. ...................... 307/455; 307/466; 307/467; 307/443; 307/480; 307/243
[58] Field of Search ............... 307/455, 466, 467, 443, 307/289, 254, 362, 364, 352, 357, 494, 243, 480

[56] References Cited

U.S. PATENT DOCUMENTS

| | | | |
|---|---|---|---|
| 3,925,691 | 12/1975 | Gaskill et al. | 307/455 |
| 4,041,326 | 8/1977 | Robinson | 307/455 |
| 4,258,274 | 3/1981 | Nagashima et al. | 307/355 |
| 4,506,171 | 3/1985 | Evans et al. | 307/362 |
| 4,628,216 | 12/1986 | Mazumder | 307/455 |
| 4,629,911 | 12/1986 | Bebernes et al. | 307/362 |
| 4,695,749 | 9/1987 | Lam | 307/455 |
| 4,755,693 | 7/1988 | Suzuki et al. | 307/455 |

FOREIGN PATENT DOCUMENTS 0043018 3/1986 Japan ..................... 307/355

OTHER PUBLICATIONS

Nosowicz, "Cascode Magnitude Compare Circuit", IBM Tech. Disclosure Bulletin, vol. 24, No. 5, Oct. 1981.

Primary Examiner—Stanley D. Miller
Assistant Examiner—Trong Quang Phan
Attorney, Agent, or Firm—Kenyon & Kenyon

[57] ABSTRACT

A method and apparatus for providing an emitter coupled logic 2 to 1 multiplexer latch. The latch has a feedback loop for latching data within the loop and at least two data ports for transmitting data. A single differential amplifier having emitter coupled transistors are coupled to the feedback loop and to the data ports and is responsive to control signals to selectively cause either the feedback loop to latch data or a selected one of the data ports to transmit data. The control signals are derived from a single clock signal, its inversion and a select signal. A nonoverlap region is created by raising the voltage range of either the clock signal or its inversion so that A and B latches can be used.

9 Claims, 4 Drawing Sheets

ECL MUX LATCH

FIELD OF THE INVENTION

The present invention relates to the field of computer hardware, and more specifically, to a 2 to 1 emitter coupled logic multiplexer latch.

BACKGROUND OF THE INVENTION

A 2 to 1 multiplexer latch is implementable with bipolar integrated circuit design using emitter coupled logic. A mux latch (multiplexer/latch combination) is a standard latch function used in the design of digital logic, and especially in the design of computers. It latches a piece of data in a given state. The latch part of the mux latch holds data when the clock port is held in a given state and it transmits data when the clock pulse is switched to the opposite state. The clock port is generally controlled by a master system clock generated and distributed in different parts of a system.

The multiplexer part of the mux latch is a logic element that accepts data from two places and, under the control of a select port, decides which of the two pieces of data to transmit from the output of the latch. The 2 to 1 mux latch, therefore, accepts data from two sources, and under control of both the clock and the select ports, transmits one of the pieces of data from its output port, or latches the data.

Emitter coupled logic refers to a method of creating a digital logic function using bipolar transistors wired as a differential amplifier with an emitter follower used as an output buffer. An advantage of emitter coupled logic is its high speed, but this comes at a cost of increased power dissipation. Anything done to reduce the power dissipation increases the usefulness of the emitter coupled logic circuitry. One method to reduce the power drain has been to simply lower the supply voltage. However, this approach would not permit the use of 2 to 1 mux latches in the present art.

Another way to reduce the power dissipation is to decrease the number of transistors used for a logic function. In the prior art, a total of four latches are connected to a single clock stage and a single select stage, and receive their clock and select signals from these stages. Each of the four latches has three levels of series gating. Therefore, the voltage supply has to be large enough to support these three levels of gating in order for the circuit to be used. By reducing the number of levels of series gating, a reduced power drain can be achieved. Attempts in the prior art to create the 2 to 1 mux latch function with two levels of series gating have sacrificed the advantageous speed of the device.

It is therefore an object of the present invention to provide a 2 to 1 mux latch function using ECL circuitry with two levels of series gating, without sacrificing the speed advantages of circuits using three levels of series gating.

SUMMARY OF THE INVENTION

This and other objects of the present invention are achieved in an emitter coupled logic 2 to 1 multiplexer latch that has a feedback loop for latching data within the loop, and at least two data input ports. A single differential amplifier having emitter coupled transistors is connected to the feedback loop and to the data ports and is responsive to control signals to selectively cause either the feedback loop to latch data or a selected one of the data ports to transmit data.

Since only a single differential amplifier having emitter coupled transistors is used, instead of two differential amplifiers to individually cause the feedback loop to latch data or select one of the data ports to transmit data, a savings in the number of transistors used and power dissipation is achieved.

The objects of the invention are also achieved by providing for dual clocking of A and B latches distributed over a chip from a single clock signal. The method of the invention includes the steps of distributing a clock signal and an inversion of the clock signal through a distribution network of differential amplifiers to latches in various areas of the chip. The clock signal and the inverted clock signal are inputted to first and second inputs respectively of an A latch. The voltage range of the clock signal is raised relative to the inverted clock signal so that the A latch is in a latched mode for a longer period of time than it is in a data mode. The clock signal and the inverted clock signal are also inputted to the second and first inputs, respectively, of a B latch. The voltage range of the inverted clock signal relative to the clock signal is raised in this B latch so that the B latch is in a latch mode for a longer period of time than it is in a data mode, so that non-overlapped periods of time during which first A latches and then B latches are in a data mode is created.

By providing a single pair of differential clock signals to the latches, skewing problems between latches in different areas are avoided. From the single pair of clock signals, each set of latches derives a clock signal that puts the latch into a latch mode for a longer period of time than the latch is in the data mode. By swapping the clock inputs to a latch, one type of latch, which is in latch mode when the other type of latch is in data mode, is obtained. To assure proper operation of the two types of latches (A and B), the lengthening of the latch mode and the shortening of the data mode in both latches assures a non-overlap time between one latch entering a latch mode and the other exiting a latch mode. This prevents data from being improperly passed through both A and B latches, instead of the proper passing of data from one latch to the next.

Other objects, features and advantages of the present invention will be apparent in the accompanying drawings and from a detailed description which follows below.

DETAILED DESCRIPTION

Figure 1:
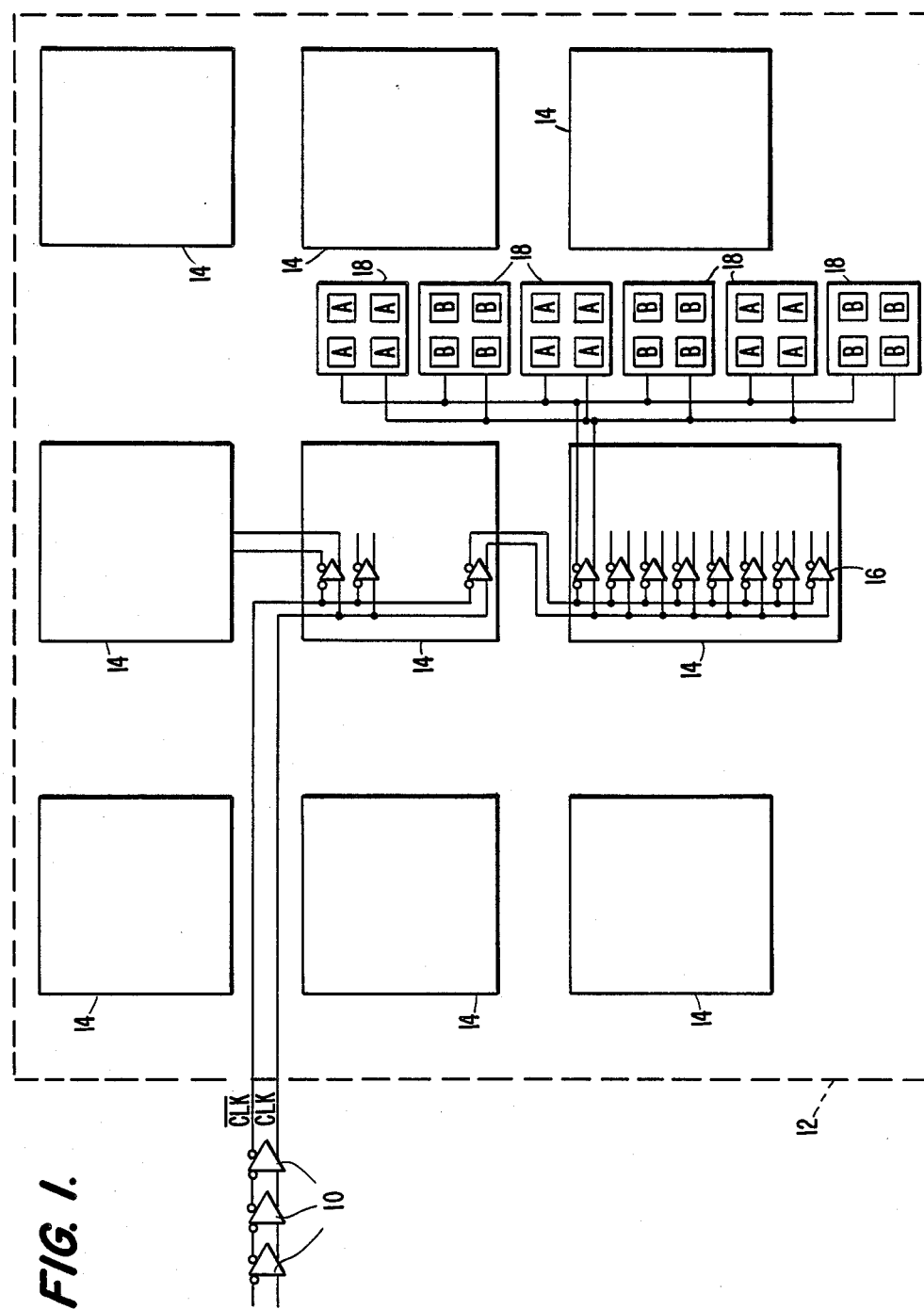
FIG. 1 is schematic block diagram of a chip on which latches are arranged, illustrating the distribution of clocking signals on a chip, according to the present invention.

An embodiment of a distributed clock scheme according to the present invention is illustrated in FIG. 1. A number of differential amplifiers 10 in series ar connected to a chip 12. On the chip 12 are nine distribution cells 14. Each distribution cell 14 has eight differential amplifiers 16. The signals being carried by the differential amplifiers 10 on its two lines are a clock signal (CLK) and the inversion of this clock signal ($\overline{\text{CLK}}$). These two signals from the differential amplifiers 10 are received by the central distribution cell 14a. the differential amplifier 16 of central distribution cell 14a then distributes again the two signals CLK, $\overline{\text{CLK}}$ to each of the other eight surrounding distribution cells 14.

Each of the eight differential amplifiers 16 of each of the eight surrounding distribution cells 14 is connected to six sets of four mux latches 18 (or other non-multiplexed simple latches). Every set of four mux latches 18 can be connected to a differential amplifier 16 so that the latches are all A latches or all B latches, as will be explained in more detail later.

There are more chips like 12 although they are not shown in FIG. 1. These other chips are connected to one of the sequentially arranged differential amplifiers 10 leading to chip 12. Which specific differential amplifier a particular chip is connected to will be chosen in a manner to reduce the skew between chips.

Figure 2:
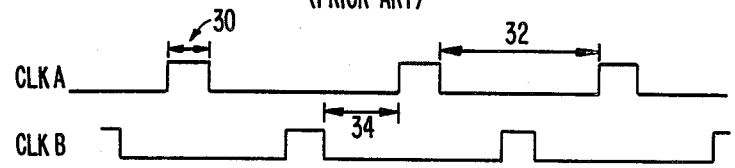
FIG. 2 shows a typical two-phase clock timing diagram.

Prior art clock signals, CLK A, CLK B are shown in prior art FIG. 2. The time a latch is in the data mode (when data will pass through the latch) is indicated by arrow 30. The time the latch is in the latch mode (when data is latched or held) is indicated by arrow 32. Note that at no time are both the A and B latches in the data mode. If they were, then data would improperly pass right through both latches. The time when both latches are in latch mode is the non-overlap time and is indicated by arrow 34. Because of skewing problems, in the prior art this area needs to be large, but the larger this area, the more time is wasted.

To avoid the problems of skewing, the present invention brings a single pair of clock signals into each chip. It is on the chip that the present invention creates a two-phase clock with a non-overlap region from the single clock signal (and its inversion). However, since this is done at the latch level, and not off the chip 12 the non-overlap region can be kept relatively small because there will be little skew problem. A description of the apparatus of the present invention to create this two-phase clock is described later.

Figure 3:
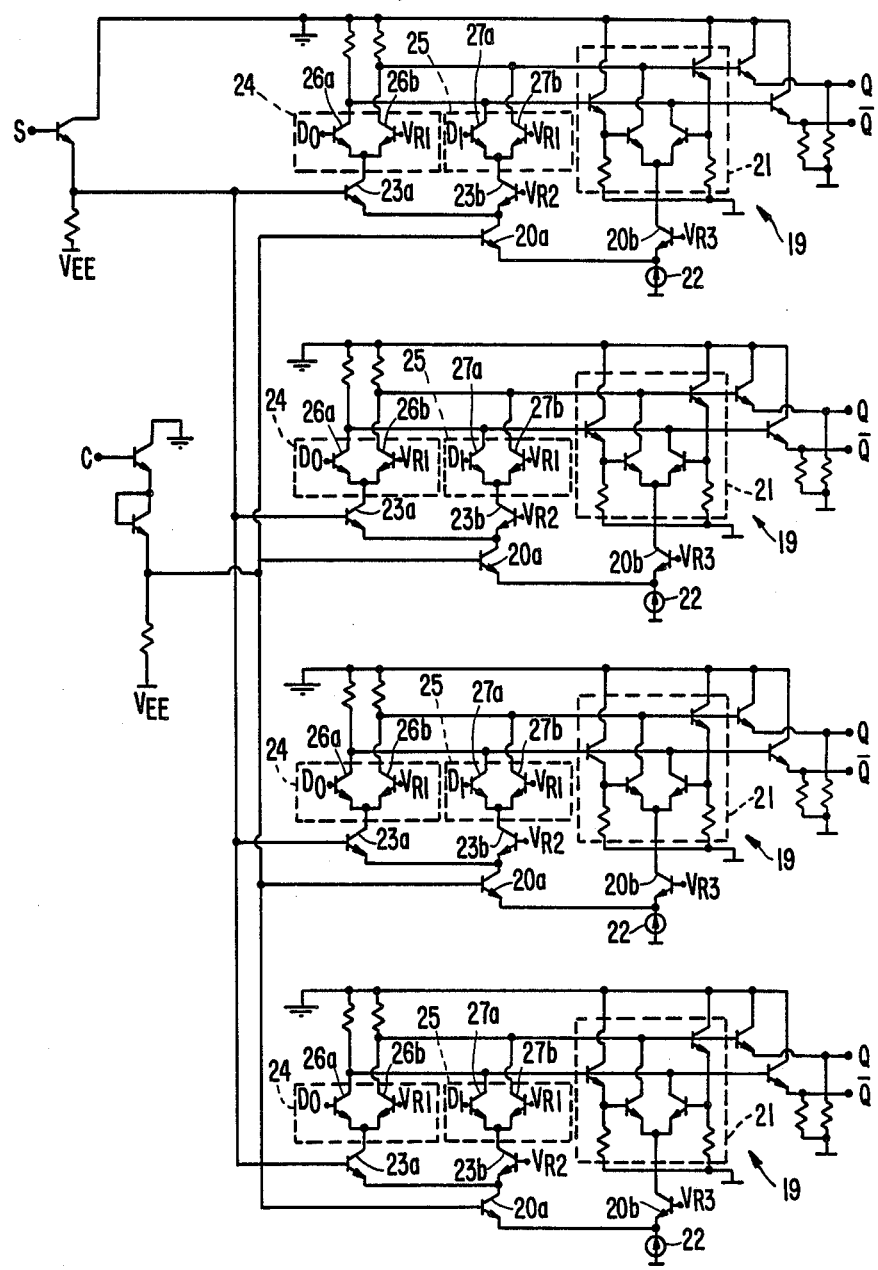
FIG. 3 shows a prior art set of four mux latches.

A prior art set of four mux latches is shown in FIG. 3. Each of the four mux latches is a two to one mux latch and therefore accepts data from two sources, and is controlled by signals at both its clock and select ports to transmit (or latch) one of the pieces of data from its output ports.

Each latch 19 has three levels of series gating. The third level is a differential amplifier comprising transistors 20a and 20b. The base of transistor 20a is connected to the clock stage. The clock stage outputs voltages between $-2.4$ volts and $-3.0$ volts. The base of the other transistor 20b is connected to a voltage reference $V_{R3} = -2.7$ volts. The collector of transistor 20b is connected to a positive feedback loop 21, and the emitters of transistors 20a, 20b are connected to constant current source 22, with $V_{EE} = -5.2$ volts. When the voltage on the base of transistor 20a is lower than $V_{R3}$, (clock not enabled), then transistor 20b will win and be open and data in loop 21 will be held or latched. It will remain latched until the voltage on the base of transistor 20a becomes higher than $V_{R3}$ (when the clock is enabled), so that the multiplexer function is created.

The second level of series gating is the differential amplifier comprising transistors 23a and 23b. The base of transistor 23b is connected to a reference voltage $V_{R2} = -1.9$ volts. The base of transistor 23a is connected to the select stage, and the voltage on this base from the select stage varies from $-1.6$ to $-2.2$ volts. The emitters of the transistors 23a, 23b are connected to the collector of transistor 20a. Thus, these transistors 23a, 23b come into play only when transistor220a is on, i.e., when the multiplexer function is created.

The collector of transistor 23a is connected to the emitters of a first transistor pair 26a, 26b in the first level of gating, while the collector of transistor 23b is connected to the emitters of a second transistor pair 27a, 27b. The base of transistors 26b and 27b are each connected to reference voltage $V_{R1} = -1.1$ volts, while the bases of transistors 26a and 27a are respectively connected to data 0 and data 1, which each vary between values of $-0.8$ to $-1.4$ volts.

In operation, when the clock is not enabled, transistor 20b in the third level wins, causing a latch mode to be entered, thereby latching the data in the feedback loop 21. When the clock is enabled, transistor 20a wins, since the voltage at its base ($-2.4$ volts) is higher than $V_{R3}$ ($-2.7$ volts), so that the multiplexer function is created. The voltage from the select line on the base of transistor 23a determines which pair of transistors 26a, 26b or 27a, 27b will be selected. A voltage higher than $V_{R2}$ ($-1.9$ volts) will cause transistor pair 26a, 26b to be selected; a voltage lower than $V_{R2}$ will cause transistor pair 27a, 27b to be selected. Finally, a high signal will be transmitted if there is data (a higher voltage signal than $V_{R1}$) at the base of whichever transistor, 26a or 27a is active.

As can be seen in FIG. 3, these three levels of logic appear in all four latches, so that $V_{EE}$ is $-5.2$ volts. With large scale and very large scale integration emitter coupled logic, the power dissipation is a serious limitation to the usefulness of the circuits of FIG. 3.

Figure 4:
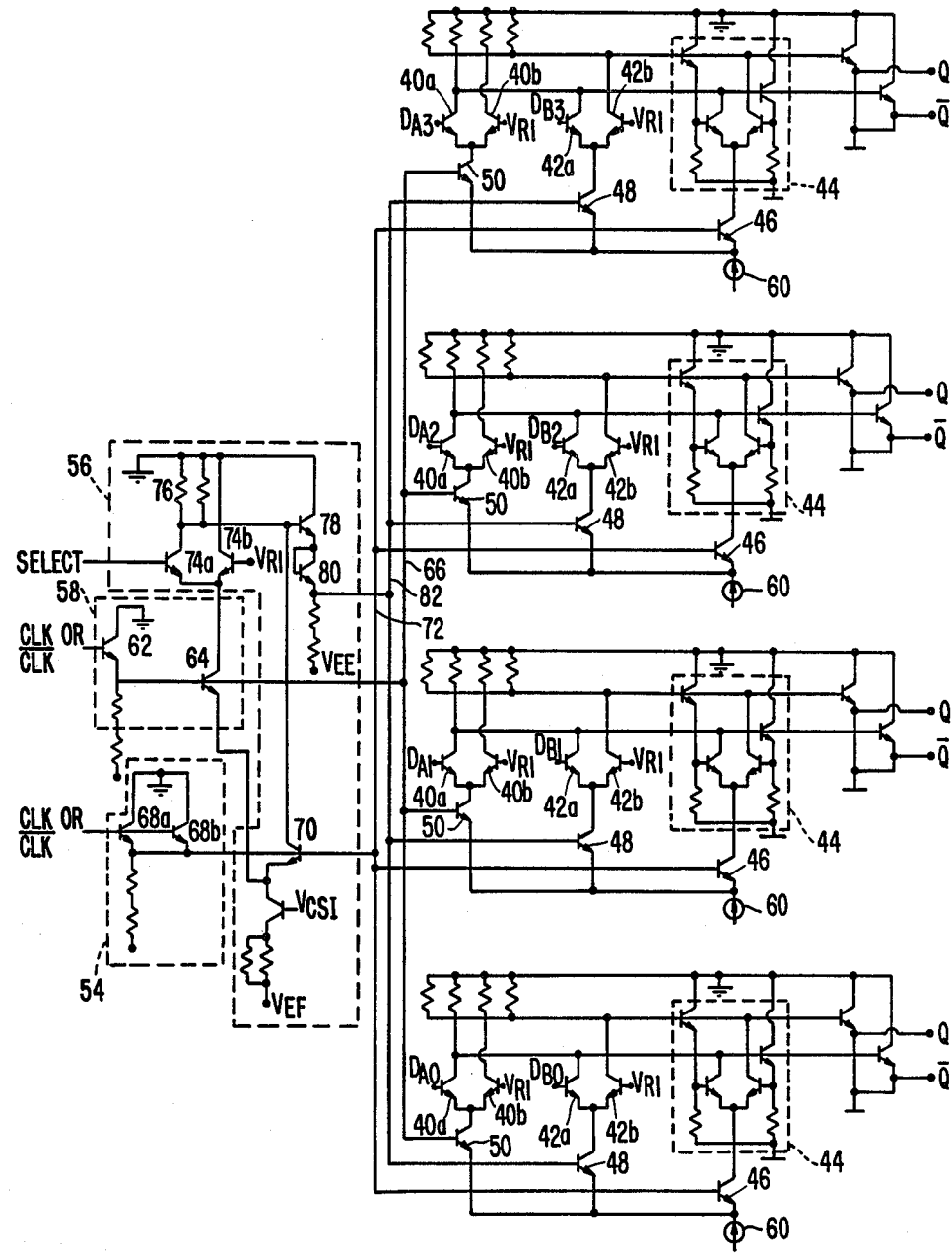
FIG. 4 shows a set of four mux latches and their input stages constructed according to the present invention.

A reduction in the power can be had by reducing the number of levels of series gating to two. The present invention, as seen in FIG. 4, provides only two levels of gating in each latch. This also reduces the transistor count, and therefore increases the density of each latch. The structure and operation of the uppermost level, including the pairs of transistors 40a, 40b and 42a, 42b and feedback loop 44, are the same as in the prior art of FIG. 3. However, the present invention controls this upper level with a single level of gating in each latch.

The collector of transistor 46 is connected to the positive feedback loop 44, and the base of transistor 4 is connected to the output of a second clock stage 54. The collector of transistor 48 is connected to the emitters of transistor pair 42a, 42b, while its base is connected to the output of a select stage 56. The collector of transistor 50 is connected to the emitters of transistor pair 40a, 40b, while its base is connected to the output of a first clock stage 58. The emitters of transistors 46, 48 and 50 are coupled together to form a single differential amplifier that is connected to constant current source 60.

The first clock stage 58 has a transistor 62 whose emitter is connected to the base of transistor 64 and to first clock line 66. The voltage on line 66 ranges from −1.9 to −2.2 volts when the base voltage of transistor 62 ranges from −1.1 to −1.4 volts.

The second clock stage 54 has two transistors 68a, 68b, each of which is twice as large as transistor 62. Thus, there will be a diode which is four times as large in size as that of transistor 62. The emitters of transistors 68a, 68b are connected to the base of transistor 70 and to the second clock line 72. The signal on line 72 ranges from −1.865 to −2.165 volts when the base voltage of transistors 68a, 68b ranges from −1.1 to −1.4 volts.

The equation which describes the difference in voltage caused by the different size of transistor is:

$$V = \frac{kT}{q} \ln(\Delta \text{Area}); \text{ where } \frac{kT}{q} \sim 25.6 \text{ mV}$$

@ ROOM TEMP or 27° C. and

Area in this Case = 4 so that $\Delta V = .035$ V

The select stage 56 includes a pair of emitter coupled transistors 74a, 74b. The collector of transistor 74a is connected to ground through resistor 76, while the collector of transistor 74b is connected directly to ground. The output of the select stage 56 is formed by two transistors 78, 80, the base of transistor 78 connected to the collector of transistor 74a and its collector connected to the ground. The emitter of transistor 78 is connected to the base and collector of transistor 80, whose emitter is coupled to select line 82.

The value of the resistance 76 is such that when the voltage on the base of transistor 74a is high (and the voltage on base of 62a is high), the voltage on line 82 will be a low (−2.2 volts) because transistor 74a will be on, and the voltage will drop over the resistance 76, no matter what state the CLK, $\overline{\text{CLK}}$ signals are in because either transistor 74a or 70 will be conducting. When transistor 70 is conducting, it will be pulling the current out of the resistance 76. When there is a select low, if the base voltage of transistor 62 is high, current will flow through transistor 74b and transistor 64 so that the output on select line 82 will be high. If transistor 68 is high, then transistor 70 will be on, current will be pulled through the resistance 76 and the output on select line 82 will be low. The voltage at select line 82 will thus track the ups and downs of the output voltages of the first clock stage 62 when the select signal is low, but the highest voltage on select line 82 will be −1.6 volts, a value greater than the highest voltage obtainable on the first select line 66. When the select signal is high, the output will be a low regardless of the clock signals.

A description of the operation of the invention now follows. It must first be remembered that whichever of the transistors 46, 48 or 50 of the differential amplifier has the highest base voltage will be on, while the other two transistors will be off.

The input to the select stage 56 is random. The input to the first clock stage 58, in the example of an A latch, is the CLK shown in FIG. 5a after t=a, when CLK=L and $\overline{\text{CLK}}$=H, and the input to the second clock stage 54 is the inverted clock signal $\overline{\text{CLK}}$. For the moment, we will assume that voltage signal on the first signal line 66 is CLK, and on the second signal line 72 is $\overline{\text{CLK}}$ (shown in solid line), although these signals are actually approximately 0.8 volts below the CLK and $\overline{\text{CLK}}$ signals that are inputs to the first and second clock stages 58, 54.

When $\overline{\text{CLK}}$ is greater than CLK, transistor 46 will be on and transistors 48 and 50 will be off. (Transistor 48 will be off since the voltage on the select line 82 is always low when the voltage on 66 is low, independent of the voltage of transistor 74a's base.) Any data is latched in the positive feedback loop 44, and will be held there until transistor 46 turns off. This happens when CLK becomes higher than $\overline{\text{CLK}}$, and the latch is now in the data mode, ready to transmit data from one of the two transistor pairs 40a, 40b or 42a, 42b. When input to the select stage 56 is high, then its output on line 82 is low, so that transistor 50 wins and the multiplexer selects data on the transistor pair 40a, 40b. When the input to the select stage 56 is low, the output on line 82 is high (−1.6 volts) which is higher than the −1.9 volt high of the clock signal on line 66. This turns off transistor 50 and turns on transistor 48, so that transistor pair 42a, 42b is selected.

A problem would occur if the highs and lows on the voltages on lines 66 and 72 were equal. Since a CLK and $\overline{\text{CLK}}$ signal are symmetrical, the latch and data modes would be of equal length. The use of an A and B latch would be very difficult since there would not be a nonoverlap region because the B latch has a data and a latch timing diagram which is the inverse of the A latch timing diagram. What is needed is to shorten the amount of time the latches are in the data mode and lengthen the amount of time the latches are in the latch mode. The provision of the two, double sized transistors 68a, 68b in the second clock stage 54 accomplishes this.

Figure 5A:
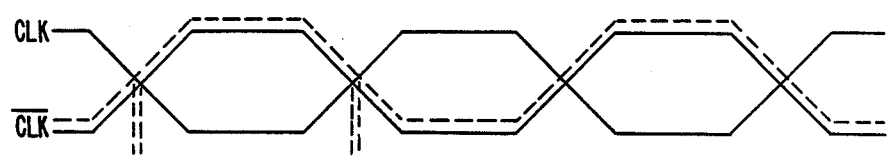
FIG. 5a shows a clock and clock bar signal that is input to the latches of FIG. 4.

As explained earlier, the smaller drop created by the two transistors 68a, 68b gives a voltage range of −1.865 to −2.165 volts on line 72, this range being higher than that of line 66. This is illustrated in FIG. 5a. A solid line shows the CLK signal that is the output of first clock stage 58 and the $\overline{\text{CLK}}$ signal that would be the output of the second clock stage 54 if it had one transistor of the same size as transistor 62. However, because of the four-sized drop, the $\overline{\text{CLK}}$ signal on line 72 is elevated, as seen in dashed lines.

Figure 5B:
FIG. 5b shows the data and latch times derived from the diagram of FIG. 5a when the inverted clock signal is not raised.

The cross-over points of the CLK, $\overline{\text{CLK}}$ signals without the elevation of $\overline{\text{CLK}}$, gives the symmetrical latch and data signal as shown in FIG. 5b. The latch mode is entered when the $\overline{\text{CLK}}$ signal is higher than CLK. With the elevated $\overline{\text{CLK}}$ signal, the cross-over points are changed. The latch and data diagram of a batch with the elevated $\overline{\text{CLK}}$ signal is shown in FIG. 5c and has lengthened latch times and shortened data times.

Figure 5C:
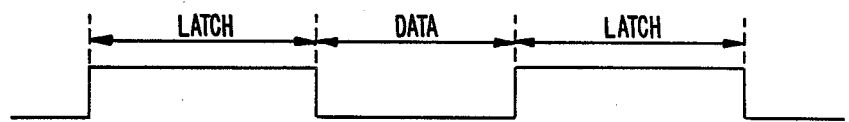
FIG. 5c shows the data and latch times derived from the diagram of FIG. 5a when the inverted clock signal is raised according to the present invention.
Figure 5D:
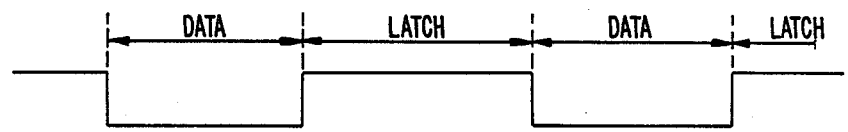
FIG. 5d shows the data and latch times for a latch which has its clock and inverted clock signal inputs reversed from the example of FIG. 5c.

By switching the input signals to the first and second clock stages 58, 54, the inversion of the latch and data timing diagram of FIG. 5c is obtained so that the latch is a B latch. This is shown in FIG. 5d. A comparison of FIGS. 5c and 5d show that a non-overlapping region between the latch modes of the A and B latches has been created from the single clock signal and its inversion $\overline{\text{CLK}}$, while also achieving an increase in density or a reduction in transistor count since a level of gating has been removed in each of the four mux latches, while adding only one additional clock stage.

In the foregoing specification, the invention has been described with reference to a specific exemplary embodiment thereof. It will, however, be evident that various modifications and changes may be made thereto without departing from the broader spirit and scope of the invention as set forth in the claims. The specification and drawings are, accordingly to be regarded in a relative rather than a restrictive sense.

What is claimed:

1. An apparatus for providing dual clocking of A and B latches distributed over a chip from a single clock signal and an inversion of the single clock signal, the A and B latches having data input ports which transmit data, the apparatus comprising:
   a distribution network of differential amplifiers coupled to said A and B latches such that each said A and B latch receives both said clock signal and said inverted clock signal at opposite inputs respectively;
   a first circuit coupled to the distribution network which raises a voltage range of said clock signal relative to a voltage range of said inverted clock signal in said A latch and the voltage range of said clock signal relative to the voltage range of said clock signal in said B latch; and
   a second circuit, coupled to the first circuit, which causes each A and B latch to latch data for a period of time greater than the period of time when one of the data input ports transmits data during each period of said clock signal.

2. An emitter coupled N to 1 multiplexer latch wherein N is at least two, comprising:
   a positive feedback loop forming a latch;
   at least two data input ports; and
   a single differential amplifier having a first emitter coupled transistor coupled to one of said data input ports, a second emitter coupled transistor coupled to said positive feedback loop, and a third emitter coupled transistor coupled to the other data input port, each emitter coupled transistor having a base terminal and a collector terminal, said base terminals forming control inputs to said single differential amplifier, the collector terminal of said first emitter coupled transistor forming an output to said one of said data input ports, the collector terminal of said emitter coupled transistor forming an output to the other data input port, and the collector terminal of said second emitter coupled transistor forming an output to said positive feedback loop, whereby application of a control signal to one of said bases will cause an output signal to be present at one of said outputs to thereby selectively cause either said positive feedback loop to latch data or a selected one of said data input ports to transmit data.

3. A latch according to claim 2, further comprising:
   a first clock stage receiving a clock signal and outputting a first control signal to said first emitter coupled transistor in said differential amplifier;
   a second clock stage receiving an inversion of said clock signal and outputting a second control signal to said second emitter coupled transistor of said differential amplifier; and
   a select stage receiving a select signal and outputting a third control signal to said third emitter couple transistor of said differential amplifier, wherein said first, second and third emitter coupled transistors have emitters coupled together.

4. A latch according to claim 3, wherein the first second and third emitter coupled transistors of said differential amplifier are interconnected such that said first, second or third control signal having a greatest voltage will turn on one of the first, second or third emitter coupled transistors, and turn off the remaining said emitter coupled transistors.

5. A latch according to claim 4, wherein said first and second control signals each have a range of voltages, and said second clock stage includes a circuit raising a range of voltages of said second control signal higher than a range of voltages of said first control signal, such that said positive feedback loop latches data for a period of time greater than the period of time when one of said data input ports transmits data during each period of said clock signal, wherein said circuit is coupled to the second emitter coupled transistor.

6. A latch according to claim 5, wherein said first clock stage includes a transistor with at least a P diode drop, and said circuit includes at least one transistor with a Q diode drop, where P is greater than Q.

7. A latch according to claim 6, wherein the transistor with at least a P diode drop and the transistor with at least a Q diode drop are different sizes, and wherein the Q diode drop and the P diode drop are achieved with a same current to each said transistor.

8. A latch according to claim 6, wherein the transistor with at least a P diode drop and the transistor with at least a Q diode drop are a same size and said P and Q diode drops are achieved when different respective currents are provided to the transistor with at least a P diode drop and the transistor with at least a Q diode drop.

9. A method for providing dual clocking of A and B latches distributed over a chip from a single clock signal, each said A and B latch having first and second inputs and a latch mode and a data mode, the method comprising the steps of:
   distributing a clock signal and an inversion of said clock signal to a distribution network of differential amplifiers to A and B latches in various areas in said chip;
   inputting said clock signal and said inversion of said clock signal to the first and second inputs respectively of A latch;
   raising a voltage range in said A latch of said clock signal relative to said inversion of said clock signal, such that said A latch is in the latch mode for a longer period of time than said A latch is in the data mode;
   inputting said clock signal and said inversion of said clock signal to the second and first inputs respectively of a B latch; and
   raising a voltage range in said B latch of said inversion of said clock signal relative to said clock signal, such that said B latch is in the latch mode for a longer period of time than said B latch is in the data mode.

* * * * *